US008555132B2

(12) United States Patent  
Danninger et al.

(10) Patent No.: US 8,555,132 B2
(45) Date of Patent: Oct. 8, 2013

(54) MODIFICATION OF ERROR STATISTICS BEHIND EQUALIZER TO IMPROVE INTER-WORKING WITH DIFFERENT FEC CODES

(75) Inventors: Markus Danninger, Nuremberg (DE); Paul Presslein, Ebermannstadt (DE); Theodor Kupfer, Feucht (DE)

(73) Assignee: Cisco Technology, Inc., San Jose, CA (US)

( * ) Notice: Subject to any disclaimer, the term of this patent is extended or adjusted under 35 U.S.C. 154(b) by 1203 days.

(21) Appl. No.: 11/924,397

(22) Filed: Oct. 25, 2007

(65) Prior Publication Data

US 2009/0100314 A1   Apr. 16, 2009

(30) Foreign Application Priority Data

Oct. 15, 2007   (EP) .................................... 07118489

(51) Int. Cl.
*H03M 13/27* (2006.01)
*H03M 13/53* (2006.01)

(52) U.S. Cl.
USPC ........................................ 714/755; 714/701

(58) Field of Classification Search
None
See application file for complete search history.

(56) References Cited

U.S. PATENT DOCUMENTS

| | | | | |
|---|---|---|---|---|
| 4,547,887 A * | 10/1985 | Mui ................................ 375/285 |
| 4,559,625 A | 12/1985 | Berlekamp et al. |
| 5,729,559 A * | 3/1998 | Bright et al. .................. 714/786 |
| 5,734,676 A * | 3/1998 | Dingsor ......................... 375/222 |
| 6,018,523 A * | 1/2000 | Even .............................. 370/389 |
| 6,219,177 B1 * | 4/2001 | Tamura ....................... 359/341.1 |
| 6,366,624 B1 * | 4/2002 | Balachandran et al. ...... 375/341 |
| 6,606,718 B1 * | 8/2003 | Bessios ......................... 714/701 |
| 6,738,392 B1 | 5/2004 | Thurston |
| 6,865,240 B1 | 3/2005 | Kawataka |
| 6,873,613 B1 | 3/2005 | Dent |
| 6,971,057 B1 | 11/2005 | Delvaux et al. |
| 8,078,929 B2 * | 12/2011 | Ohira et al. ................... 714/746 |
| 2002/0027987 A1 * | 3/2002 | Roelse ........................... 380/29 |
| 2003/0072328 A1 | 4/2003 | Echartea et al. |
| 2003/0147585 A1 * | 8/2003 | Kikuchi et al. ................. 385/24 |

(Continued)

FOREIGN PATENT DOCUMENTS

EP   0313787 A2   5/1989
EP   1303052 A1   4/2003

(Continued)

OTHER PUBLICATIONS

Extended European Search Report—Application No. 07118489.9, Jul. 28, 2008.

(Continued)

*Primary Examiner* — Ajay Bhatia
*Assistant Examiner* — Dipakkumar Gandhi

(57) ABSTRACT

This invention relates to a receiver circuit which comprises an equalizer (27) and an error decorrelator (25). The error decorrelator being configured for changing (501; 601, 602) the position of symbols. The invention further relates to a corresponding method. This invention finally relates to an interleaving or deinterleaving method which comprises selecting a first number of symbols (204; 302) within a stream of digital data (13; 28) thereby obtaining selected symbols. The method further comprises exchanging (601, 602) the position of at least half of said first number of symbols of said selected symbols with the position of other symbols from said selected symbols. The invention further relates to an interleaving or deinterleaving circuit.

17 Claims, 10 Drawing Sheets

(56) References Cited

U.S. PATENT DOCUMENTS

| | | |
|---|---|---|
| 2006/0171532 A1* | 8/2006 | Iketani et al. .................. 380/28 |
| 2006/0212780 A1* | 9/2006 | Ohira et al. .................. 714/776 |
| 2007/0036173 A1 | 2/2007 | McCrosky et al. |
| 2007/0092027 A1 | 4/2007 | Yu et al. |

FOREIGN PATENT DOCUMENTS

| | | |
|---|---|---|
| GB | 2103053 A | 2/1983 |
| JP | H03-26337 | 11/1991 |
| JP | H08-287617 | 11/1996 |
| WO | 0072493 A1 | 11/2000 |
| WO | 2006/136883 A1 | 12/2006 |

OTHER PUBLICATIONS

Partial European Search Report; Application No. EP 07 11 8489, May 20, 2008.

Partial European Search Report in Corresponding European Application No. 11 008 793.9, dated Feb. 10, 2012.

Extended European Search Report in corresponding European Application No. 11 008 793.9, dated Mar. 30, 2012.

English translation of Office Action in counterpart Japanese Application No. 2010-528413, mailed Mar. 27, 2013.

Raghavendra, et al., "On Self-Routing in Benes and Shuffle-Exchange Networks," IEEE Transactions on Computers, vol. 40, No. 9, Sep. 1991, pp. 1057-1064.

Lenfant, "Parallel Permutations of Data: A Benes Network Control Algorithm for Frequently Used Permutations," IEEE Transactions on Computers, vol. C-27, No. 7, Jul. 1978, pp. 637-647.

Yuan, et al., "Design of cyclic shift interleavers for Turbo Codes," Ann. Telecommun., vol. 56, No. 7/08, Paris, France, Jul. 1, 2001, pp. 384-393.

Office Action in counterpart European Application No. 08838908.5, mailed Apr. 22, 2013, 6 pages.

* cited by examiner

*FIG. 6*

MODIFICATION OF ERROR STATISTICS BEHIND EQUALIZER TO IMPROVE INTER-WORKING WITH DIFFERENT FEC CODES

CROSS-REFERENCE TO RELATED APPLICATIONS

This application claims the benefit of the European patent (EP) application number 07118489.9 filed on Oct. 15, 2007 and entitled MODIFICATION OF ERROR STATISTICS BEHIND EQUALIZER TO IMPROVE INTER-WORKING WITH DIFFERENT FEC CODES the content of which is expressly incorporated herein by reference.

FIELD OF THE INVENTION

The present invention relates to forward error correction (FEC) e.g. in optical data transmission systems. The invention more specifically relates to separating error bursts, which may result from a Maximum-Likelihood Sequence Estimator (MLSE), into single errors.

Methods for forward error correction in optical data transmission systems are generally known.

An MLSE equalizer is described in WO 2005/011220 A1, which is incorporated herein by reference. Its purpose is to combat inter-symbol interference (ISI). The applicant recommends MLSE technology for non-coherent optical receivers which use photodiodes for the optical-two-electrical conversion.

The general idea of FEC codes is to calculate a block of m symbols to be transmitted or stored from a block of n message symbols, thereby extending the block of n message symbols by r=m−n redundant symbols. Redundant symbols are also designated parity symbols. Therefore, one may detect and even correct a limited number of wrong symbols within the m-symbol block.

Several FEC codes are known (cf Wikipedia, English and German version). A BCH (Bose, Chaudhuri, Hocquenghem) code is an error-correcting code that is much studied within coding theory. In technical terms a BCH code is a multilevel, cyclic, error-correcting, variable-length digital code used to correct multiple random error patterns. BCH codes may also be used with multilevel phase-shift keying whenever the number of levels is a prime number or a power of a prime number.

Reed-Solomon (RS) error correction is an error-correcting code that works by oversampling a polynomial constructed from the data to be transmitted or stored. By sampling the polynomial more often than is necessary, the polynomial is over-determined. As long as "many" of the points are received correctly, the receiver can recover the original polynomial even in the presence of a "few" bad points. Reed-Solomon codes are a sub-class of BCH codes.

RS codes are specifically useful in combating mixtures of random and burst errors. The downside of RS codes is the extensive arithmetic, which may be an obstacle for real-time and high-speed applications.

In the compact disc system, error correction and detection is provided by cross-interleaved RS code (CIRC). CIRC consists of an outer RS(24, 28) code, interleaving and an inner RS(28, 32) code. RS(24, 28) means that a block of 24 bytes is encoded to a block of 28 bytes thereby adding 4 redundant bytes. The inner RS(28, 32) code is designed to input an encoded 28-byte block of the outer RS(24, 28) code. During interleaving, a 28 byte input block resulting from the outer code is distributed over 112 output blocks of 28 bytes each. The first byte of the input block lands in the first position of the first output block. The second byte of the input block lands in the second position of the fifth output block and so on until the 28th byte of the input block lands in the 28th position of the 109th output block.

In this application symbol is mostly used as a synonym for bit. Skilled persons are aware that a symbol is a more general term which may correspond to 2 bits in quadrature phase shift keying or a byte in the context of RS codes.

For some popular BCH and RS codes integrated circuits have been developed for high-speed optical data transmission. Consequently, the International Telecommunication Union Telecommunication Standardization Sector (ITU-T) has prepared the recommendation G.975.1 titled "Forward error correction for high bit-rate DWDM submarine systems". This Recommendation describes the FEC functions that have higher-correction ability than RS(255,239) code defined in ITU-T Recommendation G.975 for the high bit-rate DWDM (Dense Wavelength Division Multiplexing) submarine cable systems. Nearly all of the codes suggested in Appendix I of recommendation G.975.1 are concatenated codes with an inner and outer code. Some codes comprise interleaving between the inner and outer code as explained in connection with CIRC above.

ITU-T Recommendation G.709 defines a frame alignment signal (FAS) as 0xF6F6F6282828 (in hexadecimal code), which is a consecutive sequence of 48 bits. A standard frame according to G.709 is 130560 bits long.

A barrel shifter (cf e.g. Wikipedia) is a digital circuit that can shift a data word by a specified number of bits. It can be implemented as a sequence of multiplexers (MUXs). In this implementation, the output of one MUX is connected to the input of the next MUX in a way that depends on the shift distance. The number of multiplexers required is $n*\log_2(n)$, for an n bit word. The barrel shifter has a variety of applications, including being a vital component in microprocessors. E.g. for a floating-point add or subtract operation, the mantissae of the numbers must be aligned, which requires shifting the smaller number to the right, increasing its exponent, until it matches the exponent of the larger number.

In the field of telecommunications, a Clos network (cf e.g. Wikipedia) is a kind of multistage switching network, first formalized by Charles Clos in 1953, which represents a theoretical idealization of practical multi-stage telephone switching systems. Clos networks are required when the physical circuit switching needs exceed the capacity of the largest feasible single crossbar switch. The key advantage of Clos networks is that the number of crosspoints which make up each crossbar switch required can be much fewer than were the entire switching system implemented with one large crossbar switch.

Clos networks have three stages: the ingress stage, middle stage, and the egress stage. Each stage is made up of a number of crossbar switches, often just called crossbars. Each call entering an ingress crossbar switch can be routed through any of the available middle stage crossbar switches, to the relevant egress crossbar switch.

Clos networks are defined by three integers n, m, and r. n represents the number of sources which feed into each of r ingress stage crossbar switches. Each ingress stage crossbar switch has m outlets, and there are m centre stage crossbar switches. There is exactly one connection between each ingress stage switch and each middle stage switch. There are r egress stage switches, each with m inputs and n outputs. Each middle stage switch is connected exactly once to each egress stage switch.

If m≥n, the Clos network is rearrangeably nonblocking, meaning that an unused input on an ingress switch can always be connected to an unused output on an egress switch, but for this to take place, existing calls may have to be rearranged by assigning them to different centre stage switches in the Clos network.

Clos networks may also be generalized to any odd number of stages. By replacing each center stage crossbar switch with a 3-stage Clos network, Clos networks of five stages may be constructed. By applying the same process repeatedly, 7, 9, 11, . . . stages are possible.

A rearrangeably nonblocking Clos network of this type with m=n=2 is generally called a Benes network. The number of inputs and outputs is N=r×n=2r. Such networks have $2 \log_2 N-1$ stages, each containing N/2 2×2 crossbar switches, and use a total of $N \log_2 N - N/2$ 2×2 crossbar switches.

The Benes network may be considered a regular connection structure using a switching element SW which has 2 data inputs I1, I2 and 2 data outputs O1, O2 as base element as shown in FIG. 13. Selection which input drives which output is made by a control signal S. If S=0, I1 is connected to O1 and I2 is connected to O2. If S=1, I1 is connected to O2 and I2 is connected to O1.

The Benes network itself may be considered as a recursive structure and stage s can be derived from (s−1) stage according to FIG. 14. It can easily be seen that the stage s has $N=2^s$ inputs. An example for a s=2 Benes network is shown in FIG. 15.

For parameter s we can derive that the Benes network has following implementation parameters:

Number of Inputs/Outputs: $NoInp = 2^s = N$

Number of switches: $NoSw = s \cdot 2^s - 2^{s-1}$

Number of stages: $NoSt = 2 \cdot s - 1$

Number of all permutations: $NoPs = s!$

The state of the art further comprises Pseudo Random Binary Sequences, sometimes also referred to as Pseudo Random Bit Sequences (PRBS) (cf e.g. Wikipedia). A binary sequence (BS) is a sequence of N bits, $$a_j \text{ for } j=0, 1, \ldots, N-1, \quad (1)$$

A PRBS is random in a sense that the value of an $a_j$ element is independent of the values of any of the other elements, similar to real random sequences.

It is 'pseudo' because it is deterministic and after N elements it starts to repeat itself, unlike real random sequences, such as sequences generated by radioactive decay or by white noise. The PRBS is more general than the n-sequence, which is a special pseudo-random binary sequence of n bits generated as the output of a linear shift register. An n-sequence always has a ½ duty cycle and its number of elements $N=2^k-1$, k≤n. In real implementations, n-sequences are used as PRBSs due to the efficient generation by linear shift registers.

The list of the bits positions that influence the input is called the tap sequence, which may be [16, 14, 13, 11]. All bits of the tap sequence are modulo-two added, which may be implemented by 3 XOR gates, each XOR gate xoring two inputs.

A linear shift register may produce an n-sequence through all possible $2^n-1$ states except the state where all bits are zero, unless it contains all zeros, in which case it will never change. The sequence of numbers generated by a linear shift register can be considered a binary numeral system just as valid as Gray code or the natural binary code.

The tap sequence of an linear shift register can be represented as a polynomial modulo 2. This means that the coefficients of the polynomial must be 1's or 0's. This is called the feedback polynomial or characteristic polynomial. For example, if the taps are at the $16^{th}$, $14^{th}$, $13^{th}$ and $11^{th}$ bits (as above), the resulting polynomial is $$1 + x^{11} + x^{13} + x^{14} + x^{16}. \quad (2)$$

The 'one' in the polynomial does not correspond to a tap. The powers of the terms represent the tapped bits, counting from the left, starting with 1.

For telecommunication purposes, ITU-T O-150 defines several PRBS for bit error rate (BER) and jitter measurements.

It is the object of this invention to provide an improved receiver, interleaving and deinterleaving circuit and method which make effective use of hardware resources.

This object is achieved by the subject matter of the independent claims.

Preferred embodiments of the invention are the subject matter of the dependent claims.

BRIEF DESCRIPTION OF THE DRAWINGS

In the following preferred embodiments of this invention are described referring to the accompanying drawings. In the drawings:

FIG. 6 illustrates a Benes network within the inventive scrambler or descrambler;

DETAILED DESCRIPTION OF THE INVENTION

Abbreviations

Figure 1:
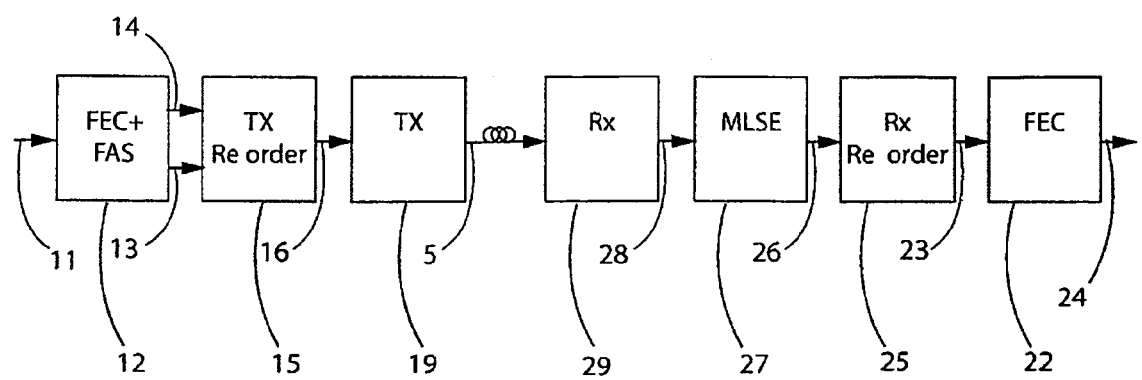
FIG. 1 shows a block diagram of an inventive transmission system.

BCH: Bose, Chaudhuri, Hocquenghem
BER: bit error rate
BS: binary sequence, sometimes also bit sequence
CIRC: cross-interleaved RS code
DSP: digital signal processor
DWDM: dense wavelength division multiplexing
f: line rate
$f_K$: f/K,
FAS: frame alignment signal (ITU G.709)
FEC: forward error correction
FL: frame length
ISI: inter-symbol interference
ITU: International Telecommunication Union K: bit width, parallelism parameter
LOF: loss of frame
LSB: least significant bit
MSB: most significant bit
MLSE: maximum-likelihood sequence estimator
MUX: multiplexer
OOF: out of frame
PRBS: pseudo random binary sequence, sometimes also pseudo random bit sequence
RAM: random access memory
ROM: read only memory
RS: Reed-Solomon
s: number of stages
T: $=1/f_K=K/f$; delay While the present invention is described with reference to the embodiments as illustrated in the following detailed description as well as in the drawings, it should be understood that the following detailed description as well as the drawings are not intended to limit the present invention to the particular illustrative embodiments disclosed, but rather the described illustrative embodiments merely exemplify the various aspects of the present invention, the scope of which is defined by the appended claims.

FIG. 1 shows a block diagram of an inventive optical data transmission system 1. The transmitter comprises a forward error correction (FEC) circuit 12, a transmitter reorder block 15 and an optical transmitter 19. The FEC circuit 12 receives a payload symbol stream 11 to be transmitted and outputs a framed symbol stream 13 into which redundant symbols have been inserted. Moreover, the FEC circuit 12 inserts framing bits which are used for synchronization purposes on the receiver side. We have assigned this functionality to the FEC circuit 12, which, consequently outputs a frame position information 14 to the transmitter reorder block 15, which will be explained in more detail in connection with FIG. 2. The transmitter reorder block 15 outputs a reordered symbol stream 16 to the optical transmitter 19. The optical transmitter in 19 transforms its electrical input to an optical signal which is transmitted by an optical fiber 5 to the receiver.

The receiver comprises an optical receiver 29, an equalizer 27, a error decorrelator 25 and a forward error correction circuit 22. The receiver basically performs the same operations as the transmitter in reversed order to regenerating the payload symbol stream 21. The reference numbers of corresponding circuit blocks differ by 10. The optical receiver 29 converts its optical input into a analog or a quasi-analog output 28. The equalizer 27 combats inter-symbol interference (ISI) as mentioned above. The output of the equalizer 27 is the designated received reordered symbol stream 26, which deviates from the reordered symbol stream 16 by a typical BER of $10^{-3}$ to $10^{-6}$. The downside of the MLSE technology is that it tends to generate burst errors. The error decorrelator 25 separates burst errors such that they appear as isolated single errors in the framed symbol stream 23. Finally another FEC circuit 22 reduces the BER to desired values of $10^{-9}$ to $10^{-16}$.

Figure 2:
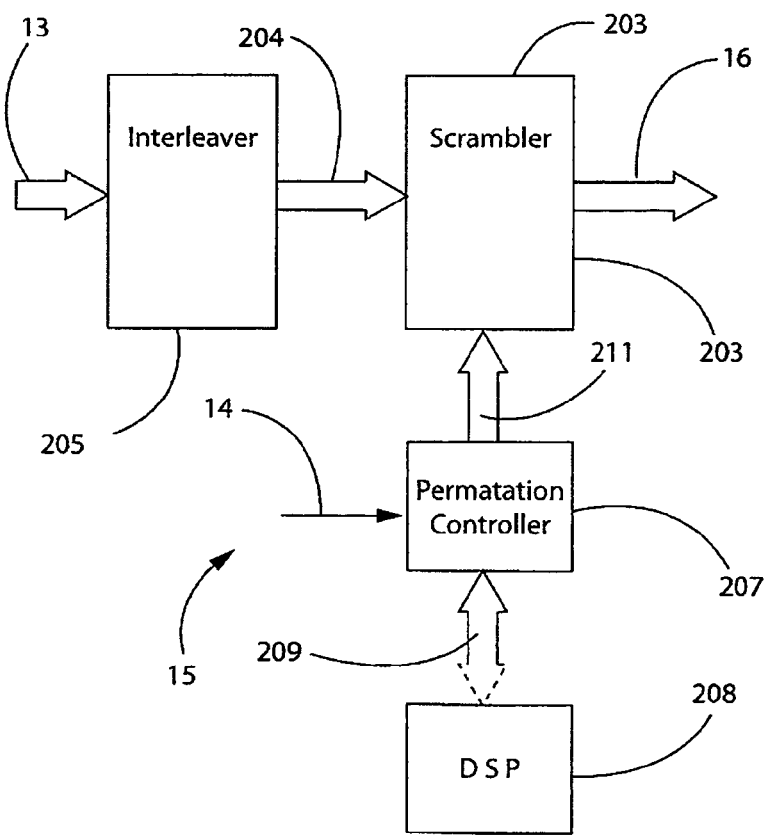
FIG. 2 shows a block diagram of a transmitter reorder block.

FIG. 2 shows a block diagram of a transmitter reorder block 15, which comprises an interleaver 205, a scrambler 203, a permutation controller 207 and a digital signal processor 208. The framed symbol stream 13 and the reordered symbol stream 16 are conveyed by a data connection which is K bits wide, like most of the data connections used in the embodiments of this invention. Also the data connection 204 which forwards the output of the interleaver 205 to the scrambler 203 is K bits wide. Therefore, the clock frequency $f_K$ can be by a factor K lower than the line rate f, which is typically in the range of 10 or 40 GHz. A lower clock frequency $f_K$ simplifies circuit design and reduces power consumption. K may be 64.

Figure 9:
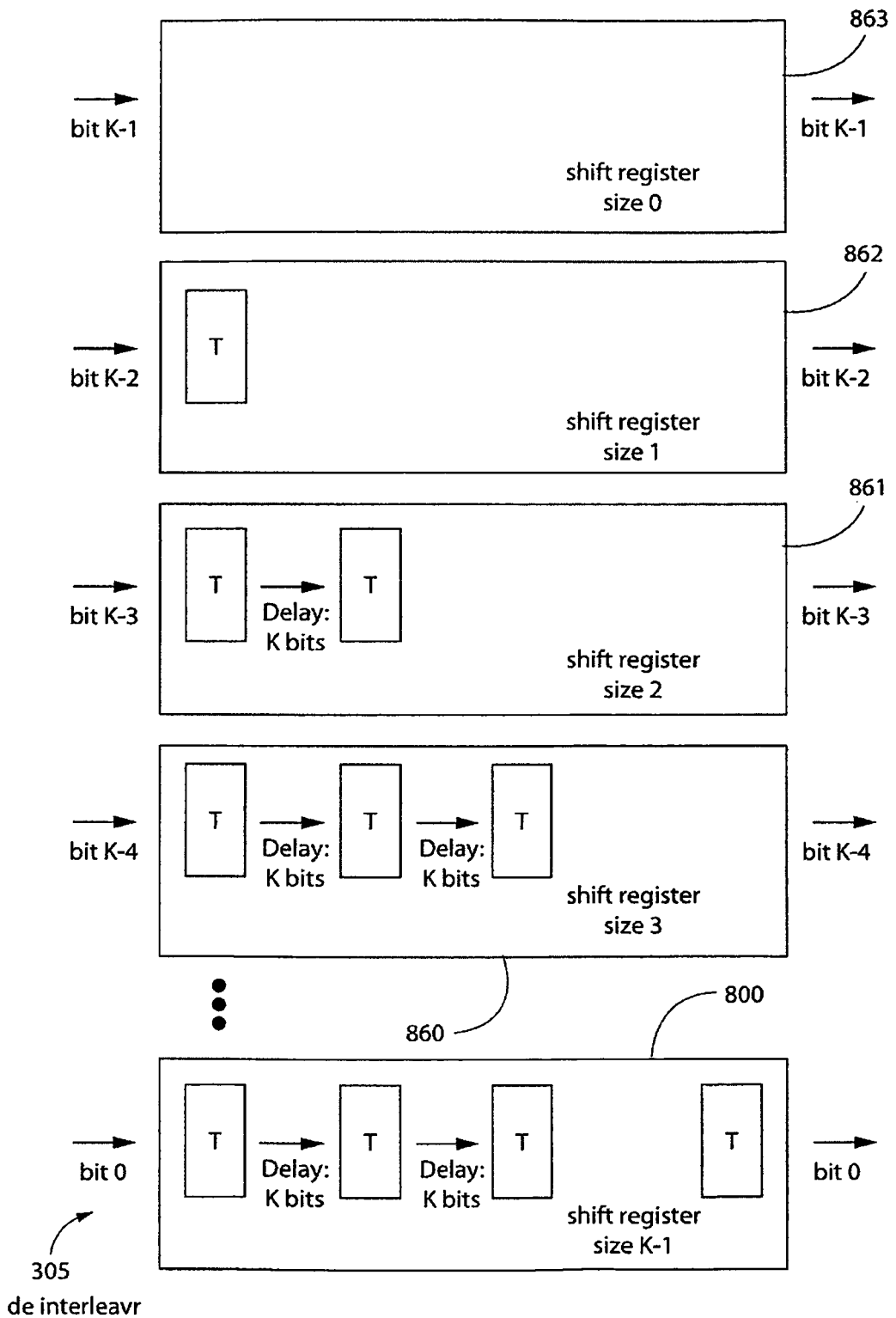
FIG. 9 shows a deinterleaver.

The interleaver 205 is opposite to deinterleaver 305, which is shown in more detail in FIG. 9. The interleaver 205 comprises K shift registers indexed from 0 to K−1 for bit 0 to bit K−1, respectively. The shift register for bit 0 has a size of 0, which means that it does not create a delay and may be considered non-existing. The $n^{th}$ shift register for bit n has a size of n, which means that it creates a delay of nT, T being the inverse of the clock rate $f_K$ and $0 \le n \le K-1$. In other embodiments the delay of each delay could be an integer multiple of one clock cycle, i.e. m*T, m≥1.

Figure 5:
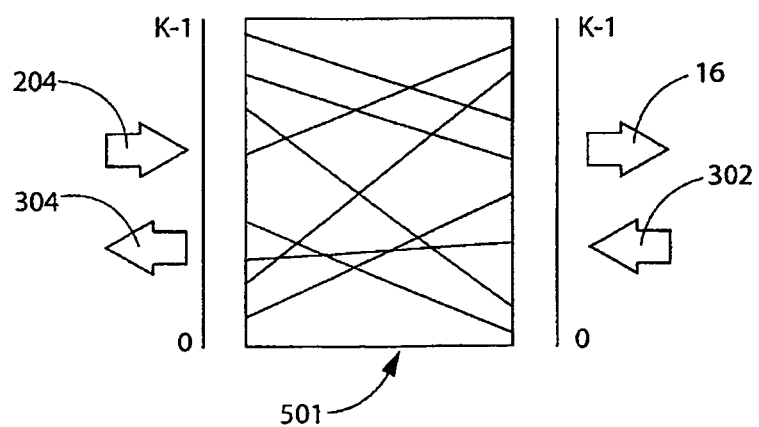
FIG. 5 illustrates an arbitrary link pattern for the inventive scrambler or descrambler.

The operation of the scrambler 203 may be illustrated by FIG. 5. The scrambler 203 exchanges the K bits present on the data connection 204 using a link pattern 501 or, in other words, generates a permutation of such K bits for outputting the reordered symbol stream 16. The permutation should be irregular in order to disturb the regularity of the interleaver 205 for the effective separation of burst errors in the receiver. PRBSs may be used to achieve this irregularity as will be described below.

The scrambler 203 may be implemented in the same fashion as the descrambler 303 by a Benes network 601 or half Benes network 602. Which permutation or link pattern the Benes or half Benes networks 601 or 602 actually performs can be controlled by permutation controller 207.

The permutation controller 207 changes the permutation or link pattern 501 every 10 clock cycles corresponding to 10 T, which makes the reordering both on the transmitter and receiver side even less regular. However, for simplifying the detection of the FAS on the receiver side, the permutation sequence is kept constant for K clock cycles equivalent to KT at the beginning of a frame after the FAS. At this point it is only important that the position of the framing bits, which constitute the FAS, is not changed by the scrambler 203, while the link patterns used during the 48 first clock cycles equivalent to 48 T may scramble non-framing bits even during the first 48 or first K clock cycles. If framing bits were scrambled, the framer 306 has no chance to find them. This means that the bottom line is that in the $0^{th}$ clock cycle bit 0 does not change its position, in the $1^{st}$ clock cycle only bit 1 must keep its position, and so on, until in the $47^{th}$ clock cycle the last framing bit, bit 47, must keep its position. If a link pattern is changed every 10 clock cycles as indicated above, the first permutation for the first 10 clock cycles transmits bits 0 to 9 in a one-to-one fashion, the second permutation for the 11 to the 20 clock cycle transmits bits 10 to 19 in a one-to-one fashion and so on.

Figure 7:
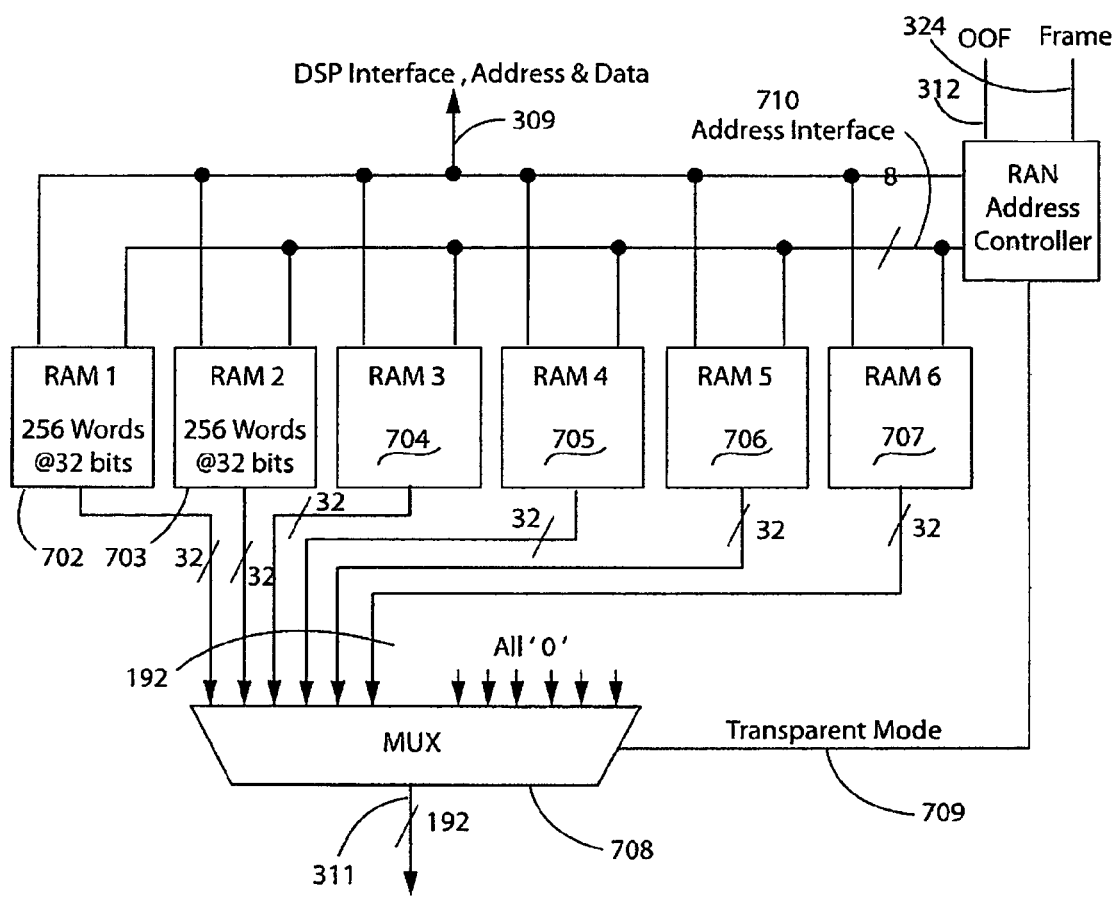
FIG. 7 shows a first embodiment of a permutation controller for the inventive scrambler or descrambler.

In another embodiment the link patterns are changed after two clock cycles during the first 64 clock cycles. This embodiment requires less one-to-one connections, namely only 2, in each of the first 32 link patterns, which renders such link patterns less regular, thereby increasing the performance of the error decorrelator 25. For changing the link pattern the FEC circuit 12 provides the frame position information 14 to the permutation controller 207. In another embodiment a separate framer before the FEC may be provided, which is not important to this invention. Permutation controllers 207 and 307 may be implemented in the same fashion as shown in FIG. 7. In particular the connections 211 and 311 may comprise 192 (=6 columns×32 rows) lines, one line for each switch in the half Benes network 602. If the network 601 or 602 comprise a different number of switches in other embodiments, still one line may be provided for each switch.

It is important that the permutation controllers 207 and 307 are synchronized and operate in a complimentary fashion, which means that the network within descrambler 303 reverses the operation of scrambler 203. This is also illustrated in FIG. 5 by the four arrows which represent the data connection 204, the reordered symbol stream 16, and the data connections 302 and 304. How this synchronization is established will be explained in more detail in connection with framer 306 and FIG. 10.

The permutation controller 207 may be connected by an interface 209 to a digital signal processor (DSP) 208. The interface 209 may be unidirectional just for writing link patterns from the DSP 208 into the permutation controller 207 or bi-directional also for reading link patterns from the permutation controller 207. The DSP 208 just illustrates that the link patterns may be updated by a control interface of the transmitter and/or during maintenance. In this way different link patterns that are optimized for certain FEC codes may be loaded through the DSP interface. DSP read and write access shall be possible without disturbing the reading of switch control values from the permutation controller 207 for the Benes network.

Figure 3:
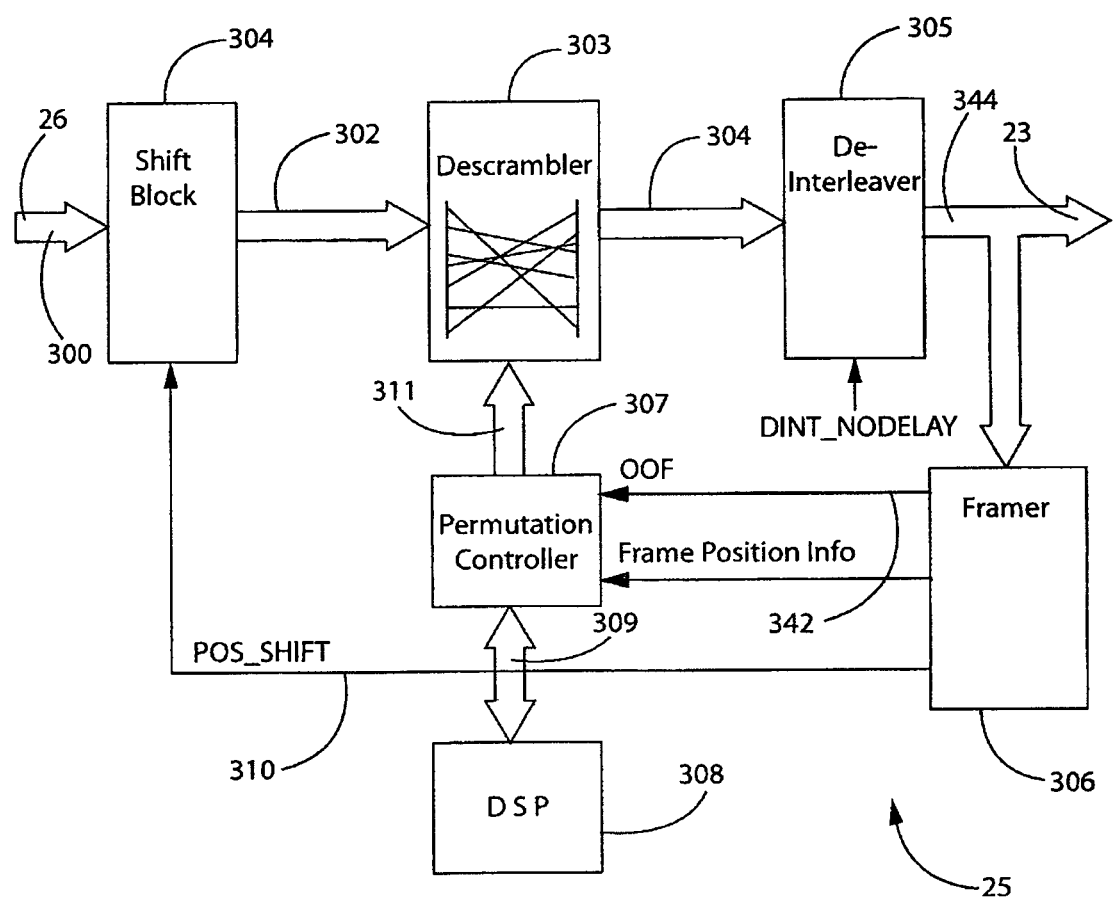
FIG. 3 shows a block diagram of a error decorrelator.

FIG. 3 shows a block diagram of a error decorrelator 25, which comprises a shift block 301, a descrambler 303, a deinterleaver 305, a framer 306, a permutation controller 307 and a DSP 308. The shift block 301 receives the received reordered symbol stream 26 on a data connection 300 and puts the FAS sequence on the up most position in the outgoing data connection 302, as will be described in more detail in connection with FIG. 4. The operation of the descrambler 303 has been described in connection with FIG. 5 and its implementation will be described in connection with FIG. 6. A possible implementation of the deinterleaver 305 will be discussed in connection with FIG. 9. K bit wide data connections 302 and 304 connect the shift block 301 with the descrambler 303 and the descrambler 303 with the deinterleaver 305, respectively. Another K bit wide data connection 314 forwards the framed symbol stream 23 output by the deinterleaver 305 to both, the framer 306 and the FEC circuit 22. The framer 306 will be discussed in connection with FIGS. 10 to 12. The data connections in FIGS. 2 and 3 may be implemented as buses, which are quite popular in digital circuits.

E.g. in case of excessive errors, re-establishing a data connection or a reset out of frame (OOF) state is declared by the framer 306 on OOF line 312 by setting this line to a logical 1. Consequently, the descrambler 303 is switched to transparent mode by the permutation controller 307 to allow the framer 306 to carry out FAS search. On the other hand, when the FAS was successfully detected and is found in each frame, the framer 306 provides frame position information on an interface 313 in a similar fashion as frame position information 14 is provided within the transmitter. The permutation controller 307 is discussed in more detail in connection with FIG. 7. The connection 311 comprises a line for each switch within the descrambler 303, i.e. 192 lines for K=64 and a half Benes network 601.

Like the permutation controller 207, the permutation controller 307 may be connected by a unidirectional or bi-directional interface 309 to a DSP 308. Again, the DSP 308 just illustrates that the link patterns may be updated by a control interface of the receiver and/or during maintenance. Again, DSP read and write access shall be possible without disturbing the reading of switch control values from the permutation controller 307 for the Benes network.

Figure 4:
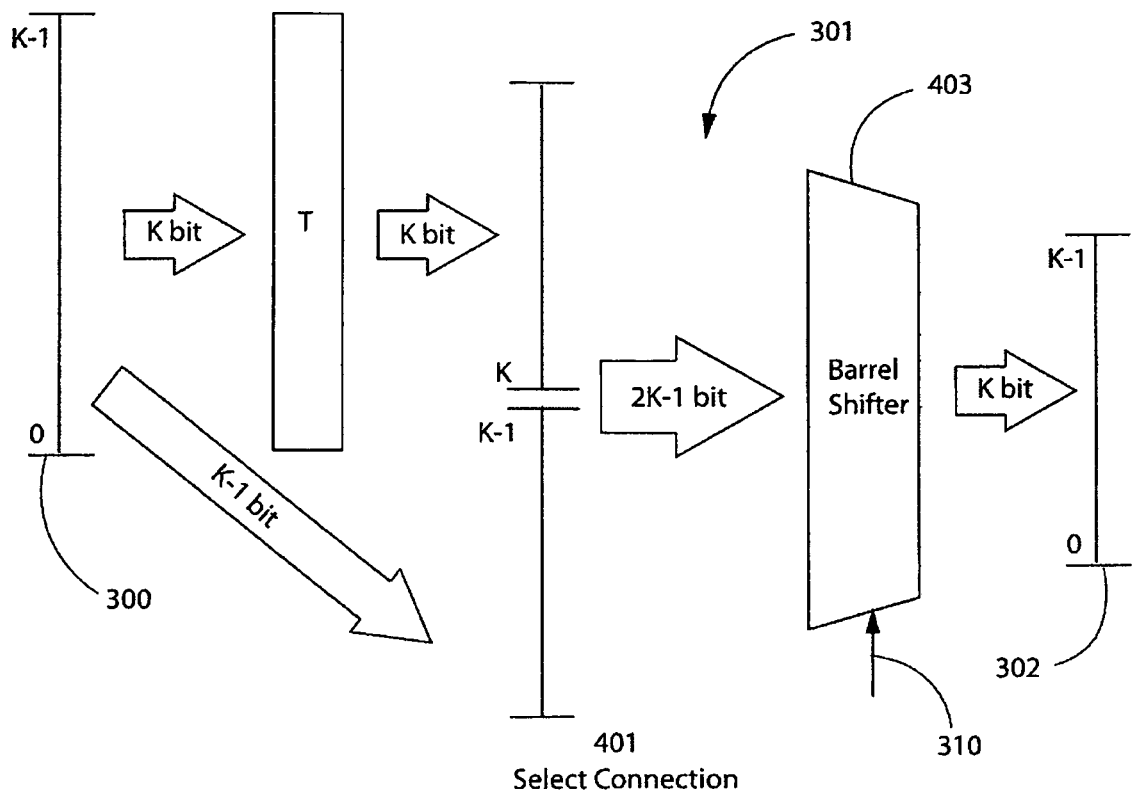
FIG. 4 illustrates the operation of a shift block.

FIG. 4 illustrates the operation and implementation of the shift block 301, which receives its control signal POS_SHIFT from the framer 306 on shift interface 310 in order to put the FAS sequence on the up most position in the data connection 302. When in synchronization, then the FAS on the data connection 302 appears on bits K−1 to K−48 with K−1 to K−24 carry 0b111101101111011011110110 (=0xF6F6F6) and bits K−25 to K−48 carry 0b001010000010100000-101000 (=0x282828). To this end a 2K−1 bit wide select connection 401 is formed which constitutes the input of barrel shifter 403. Bits 1 to K−1 of the select connection 401 are directly connected to bits 1 to K−1 of the data connection 300. All bits of the data connection 300 including bit 0 are delayed by a delay 402 by a clock cycle T. The outputs of the delay of 402 are provided at bits K to 2K−1 of the select connection 401. This means that the symbols present during the previous clock cycle at connection 300 are provided at bits K to 2K−1 of the select connection 401. Depending on the POS_SHIFT signal the barrel shifter 403 selects K bits from the select connection 401 and outputs the selected bits at the data connection 302.

POS_SHIFT can have values from 0 to K−1, i.e. for K=64 POS_SHIFT can have values from 0 up to 63. In this case, the shift interface 310 is 6 bit wide. The following table is an implementation example:

TABLE 1

| POS_SHIFT | bits selected by barrel shifter | data connection 302 |
|---|---|---|
| 0 | 127 to 64 | 63 to 0 |
| 1 | 126 to 63 | 63 to 0 |
| ... | ... | ... |
| 46 | 81 to 18 | 63 to 0 |
| 47 | 80 to 17 | 63 to 0 |
| 48 | 79 to 16 | 63 to 0 |
| ... | ... | ... |
| 62 | 65 to 2 | 63 to 0 |
| 63 | 64 to 1 | 63 to 0 |

Figure 6:
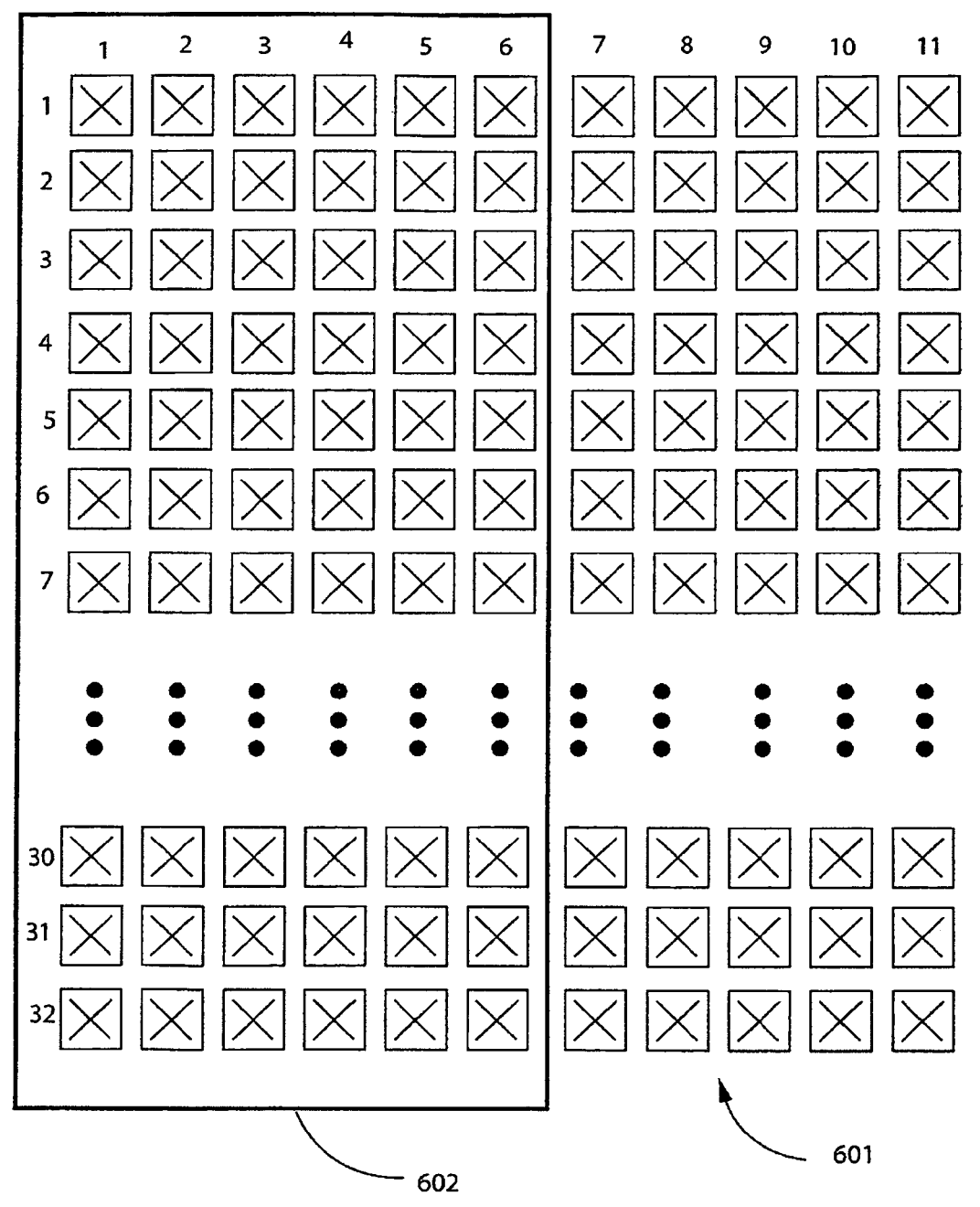

FIG. 6 illustrates a Benes network 601 within the scrambler 203 or descrambler 303 just by showing the 32 switches in each of 11 stages for K=64 input and output bits. With regard to data processing, switch (32,x) shall process data bits 63 and 62 of the 64 bit data vector, switch (31,x) shall process data bits 61 and 60, and so on and finally switch (1,x) shall process data bits 1 and 0. Switch (R,C) is the switch in row R and column C in the (half) Benes network 602 or 601.

Simulation results have shown that the slightly limited number of permutations or link patterns afforded by a half Benes network 602 do not limit the separating performance of burst errors of the error decorrelator 25.

For optimum separating performance the "trivial" link pattern in which bit n is linked to bit n and similar link patterns have to be excluded. Only irregular link patterns afford for optimum separating performance. As mentioned above, after the first K clock cycles of a frame, the permutation is changed after every 10 clock cycles. It is desirable that a link pattern is only used once per frame. For a standard G.709 frame with a frame length of 2040 clock cycles at K=64 198 different link patterns are necessary in order to avoid a repetition. Of course, 198 is much smaller than the total number of permutations $K!=1.26*10^{89}$. Therefore, permutations should be selected which are as much dissimilar as possible.

FIG. 7 shows the permutation controller 307 for the descrambler 303, provided that the descrambler 303 comprises a half Benes network 602 as shown in FIG. 6. The permutation controller 307 comprises a RAM (Random Access Memory) address controller 701, six RAMs 702 to 707 and a multiplexer (MUX) 708. As mentioned above, the connections 211 and 311 comprise 192 lines, one line for each switch in the half Benes network 602. In order to provide that much lines with reasonable input, the total RAM has been distributed into six single RAMs 702 to 707, each of which can save 256 words of a length of 32 bits. The RAM addresses range from 0 to 255. Each of the RAMs 702 to 707 can output one word equivalent to 32 bits at a time which represents one column of the matrix switches. Within one word the least significant bit (LSB) (bit 0) controls switch (1,x) and most significant bit (MSB) (bit 31) controls switch (32,x), $1 \leq x \leq 6$.

The multiplexer 708 can switch all 192 lines of connection 311 to 0, which makes the half Benes network 602 transparent. The multiplexer 708 is controlled by line 709 by the RAM address controller 701. The half Benes network 602 is switched transparent e.g. during OOF state to allow FAS search in the subsequent blocks. To this end the RAM address controller 701 is connected to the OOF line 312.

The RAM address controller 701 further receives the frame position information on interface of 313 and outputs a respective RAM address on address interface 710, which is at least 8 bit wide to select a specific word out of 256 words in each RAM. Furthermore, the RAM address controller 701 and to the RAMs 702 to 707 are connected to the DSP 308 by interface 309. This enables a change of the link patterns stored in the RAMs 702 to 707 e.g. during maintenance and disabling of the descrambler for power saving purposes. The advantage of using DSP programmable RAMs is that the link patterns can be optimized for different FEC codes. Interface 309 enables reading from and writing to the RAMs 702 to 707, although in another embodiment interface 309 may only allow writing.

In a specific embodiment of this invention, a PRBS of length $2^{16}-1$ generated with the polynomial $$1+x+x^3+x^{12}+x^{16} \qquad (3)$$

has been used. This sequence has been generated by a computer and loaded bit wise into the RAMs 702 to 707. The first 32 bits of the PRBS are written into RAM 702, address 0, starting with the MSB, the second 32 bits of the PRBS are written into RAM 703, address 0, starting with the MSB and so on until the $161^{st}$ to the $192^{nd}$ bit, which are the sixth 32 bits, are written to RAM 707, address 0, starting with the MSB again. In a similar fashion the following 192 bits of the PRBS are written to the address 1 of the RAMs 702 to 707, and so on until address 255 of the RAMs 702 to 707 is set.

Measurements with other sequences showed that such sequences performed similarly, provided that they had sufficient length without repetition. From this finding one may assume that scheme which governs the writing of the PRBS into the RAMs does not significantly influence the error separating performance.

From the size of the RAMs 702 to 707 we obtain a minimum length of $192*256 (=3*2^{14})$ bit.

In other embodiments the half Benes network could be controlled by different permutation controllers without RAM. Rather, such different permutation controllers could be based on feed-back shift registers for generating the PRBS. The downside of this approach is the high frequency required. In the discussed embodiment 192 bits have to be generated, which are 3 bits per time slot on the optical line, which requires a frequency tree times the line rate. In order to reduce such frequencies, several linear shift registers may be operated in parallel as will be discussed in connection with the second embodiment of a permutation controller shown in FIG. 8. Another viable approach could be the PRBS calculation by 32 bit or 64 bit microprocessors.

The permutation controller 207 on the transmitter side and the permutation controller 307 on the receiver side may have different construction, but must produce the same PRBS for synchronization.

The frame length is FL clock cycles. The frame position always starts with 0 when the first occurring bit of a FAS is in the processed K-bit vector. One frame ends at frame position FL−1, the next immediately starts at frame position 0 again. If the frame length is not exactly equal to 64+x*10 clock cycles (x being a positive integer), then the last address being applied will be shorter than 10 clock cycles.

If the frame length exceeds 2614 clock cycles (this is 64+255*10) then the RAM addressing shall wrap around and restart with the first address 0. The RAM address r may be calculated from the clock cycle x after the clock cycle with the FAS, which is assigned 0:

$$r=0 \text{ for } 0 \leq x \leq 63 \qquad (4)$$

$$r=\text{floor}((x-54)/10) \bmod 256 \text{ for } 64 \leq x \leq FL \qquad (5)$$

The function floor(y) returns the largest integer which is smaller than or equal to y. As mentioned above, a standard frame according to G.709 is 130560 bits long, which results in 2040 clock cycles at a parallelism parameter K=64. If the permutation is changed every 10 clock cycles, 204 words need to be read out of and need to be stored in every RAM. In other embodiments the permutation may be changed more quickly or slowly. If, e.g. the permutation is changed every 8 clock cycles, 255 words need to be comprised in every RAM, in order to avoid a wrap around in a standard frame. The permutation may be changed more slowly, e.g. after 11, 12 ore even 20 clock cycles, in order to avoid wrap around in larger frames than standard frames.

In the embodiment, in which the link pattern is changed after every two clock cycles during the first 64 clock cycles, the following formula apply:

$$r=\text{floor}(x/2), 0 \leq x \leq 63 \qquad (6)$$

$$r=(\text{floor}((x-64)/10)+32) \bmod 256, 64 \leq x \qquad (7)$$

Figure 8:
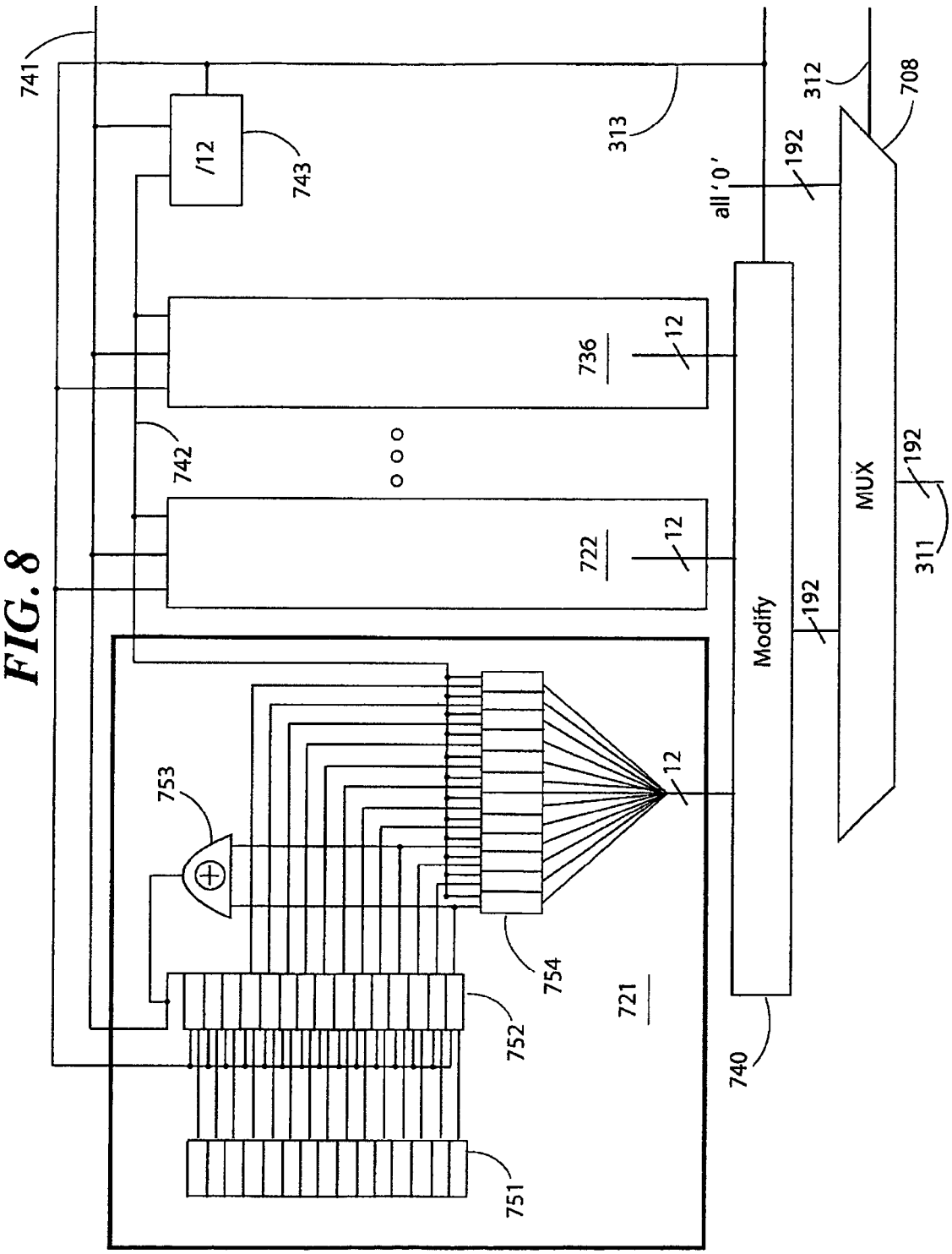
FIG. 8 shows a second embodiment of a permutation controller.

FIG. 8 shows a second embodiment of a permutation controller. This permutation controller does not store all link patterns in a RAM, rather generates the link patterns by 16 parallel PRBS circuits 721, 722, . . . and 736. Each of the PRBS circuits generates 12 bits at a time which results in the required 192 (=16*12) bits for the half Benes network. Due to the parallelism, the clock frequency of the PRBS circuits 721, 722, . . . and 736 is equivalent to the clock frequency of the transmitter reorder block 15 and the error decorrelator 25. In contrast to the other circuit diagrams, the clock line 741 is explicitly shown in FIG. 8.

All the PRBS circuits have basically the same structure, the same inputs and similar outputs. Therefore only PRBS circuit 721 is shown in more detail. The core element of each PRBS circuit is a linear shift register 752 which is 16 bits long. The bits are consecutively numbered from bit 1 at the input to bit 16 at the output. At least two bits are tapped, which are bits 13 and 16 in the embodiment shown in FIG. 8. The tapped bits are modulo-two added by one or more XOR gates 753. The result is fed back to the input of the linear shift register 752.

Since all PRBS circuits generate non-overlapping parts of the same PRBS, the same bits are tapped in each PRBS circuit. For the same reason, different values must be loaded into each linear shift register, when a new frame starts and interface 313 "resets" all PRBS circuits 721, 722, . . . and 736. To this end, ROMs 751 are provided which store the initial values, which are loaded in parallel into all linear shift registers 752 upon reset. Therefore, ROMs 751 store different values. The maximum length of a PRBS generated by a 16 bit linear shift register is $2^{16}-1$. Consequently it is desirable to have neighboring PRBS circuits generate parts of the same PRBS sequence which starting positions are equidistant, in this embodiment $2^{12}$ bits apart. By this condition, the values stored in the ROMs 751 may be obtained.

The clock is divided by frequency divider 743 by a factor 12. In addition, the frequency divider 743 is reset by interface 313 at the beginning of a new frame. Consequently, the frequency divider 743 outputs a storing signal on line 742 at clock cycles 0, 12, 24 . . . after the beginning of a frame, which starts at clock cycle 0. When a storing signal is output, bits 5 to 16 of each linear shift register are loaded in parallel into the corresponding buffer 754. While the linear shift register 752 generates the next 12 bits during the following 12 clock cycles, the buffer 754 outputs the previous 12 bits.

The modify circuit 740 modifies the link patterns output to the multiplexer 708 during the first 48 clock cycles of a frame to ensure that in the $0^{th}$ clock cycle bit 0 does not change its position, in the $1^{st}$ clock cycle only bit 1 must keep its position, and so on, until in the $47^{th}$ clock cycle the last framing bit, bit 47, must keep its position. To this end the first link pattern for the first 12 clock cycles may be modified not to change the positions of bits 1 to 12. Alternatively the modification may change from clock cycle to clock cycle or at each second clock cycle in order to generate 12 or 6, respectively, link patterns from the first link pattern. The same applies to the second to fourth link patterns for clock cycles 13 to 24, 25 to 36 and 37 to 48, mutatis mutandis.

As mentioned above, a quicker link pattern change may be desirable or a slower link pattern change may be acceptable. Therefore, e.g. only 12 PRBS circuits may be provided for a link pattern change after 16 clock cycles or 24 PRBS circuits may be provided for a link pattern change after 8 clock cycles. The length of the buffers 754 must be extended to 16 bits in the first case and may be reduced to 8 bits in the second case.

Additional circuitry may be provided to use a programmable tapping of the linear shift registers 752 for generating different PRBSs. In such embodiments the ROMs 751 may be replaced by RAMs, which may be written by DSP 308.

The multiplexer 708 operates in the same fashion as in FIG. 7.

The permutation controller 207 for the scrambler 203 differs from the permutation controller 307 only in that the permutation controller 207 does not receive an OOF signal, provided that the scrambler 203 also comprises a half Benes network 602.

FIG. 9 shows the deinterleaver 305, which may be illustrated by a triangle of delays. FIG. 9 is little bit more detailed in that it hints at a shift register for each of the K=64 bits within the data connections 304 and 314. More specifically shift registers 800, 860, 861, 862 and 863 for bits 0, K−4, K−3, K−2 and K−1, respectively are shown. The shift register for bit b comprises K−1−b delays. Each delay delays by one clock cycle T. In other embodiments the delay of each delay could be an integer multiple of one clock cycle, i.e. m*T, m≥1.

As mentioned above, the shift register for bit b comprises b delays in the interleaver 205. Therefore, the interleaver 205 and the deinterleaver 305 compensate each other by providing a total delay of T(K−1) for each of the K bits. If, in other embodiments, the delay of each delay is an integer multiple of one clock cycle, the total delay is m*T(K−2), m≥1.

For test reasons the interleaver 205 and the deinterleaver 305 can be disabled, resulting in 0 delay for each bit.

Figure 10:
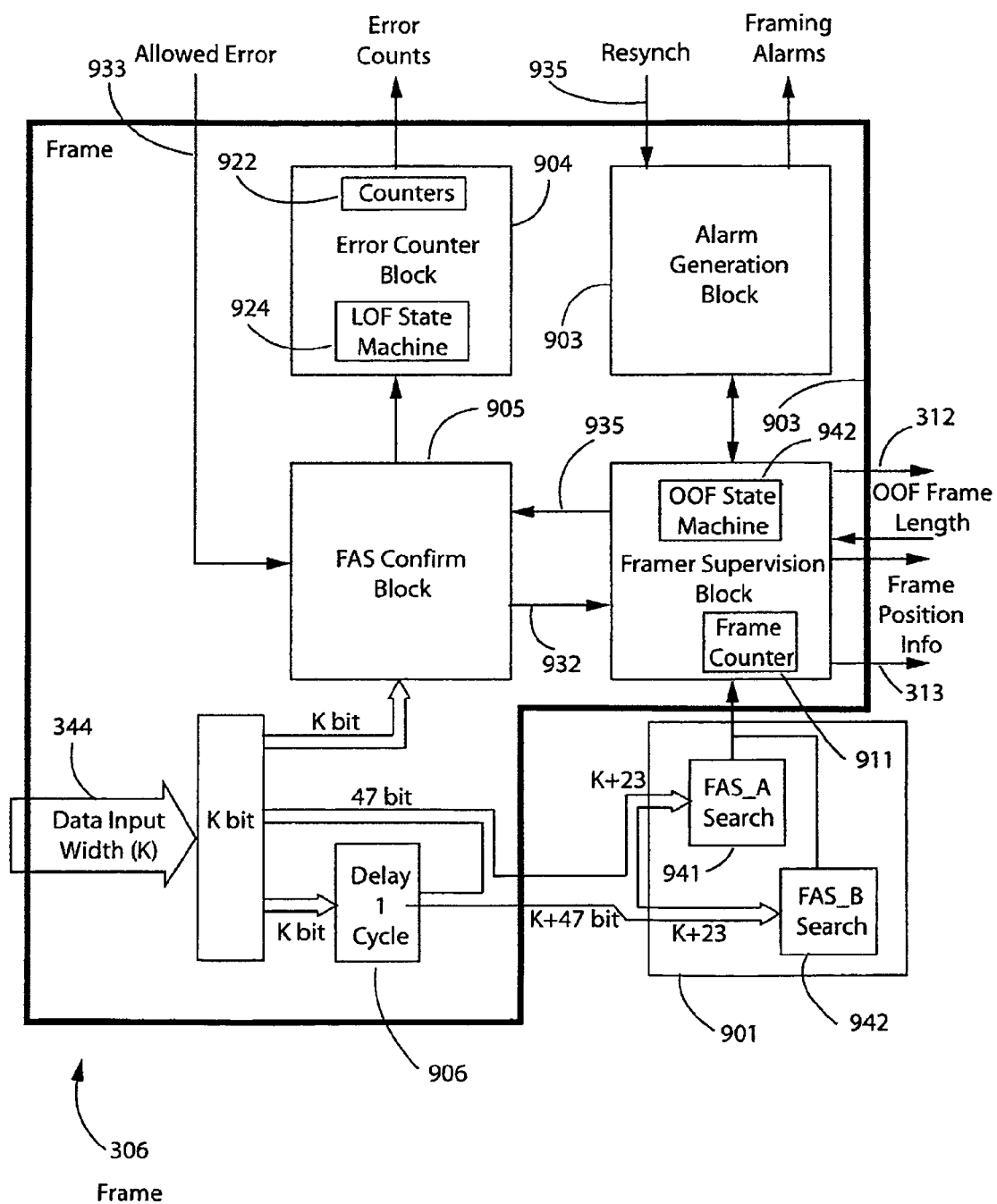
FIG. 10 shows an inventive framer.

FIG. 10 shows the framer 306, which comprises a FAS search block 901, a framer supervision block 902, an alarm generation block 903, an error counter 904, a FAS confirm block 905 and a delay 906. The framer supervision block 902 comprises an OOF state machine 912 and a frame counter 911. The error counter 904 further comprises an LOF state machine 921 and counters 922.

Though the deinterleaver 305 and descrambler 303 implement the inverse function of the interleaver 205 and scrambler 203, respectively, the data stream after the deinterleaver can still be disordered because both, the descrambler 303 and the deinterleaver 305 need to be synchronized to the FAS sequence. Therefore the framer 306 must detect the FAS in the data stream. This is explained in more detail in connection with the framing state machines in FIGS. 11 and 12.

The FAS search block 901 shall:
Detect the FAS sequence by means of K parallel search engines
Detect on which position the FAS sequence appears within the data bus
Provide a shift signal by the frame supervision block 902 to the shift block 301
Provide a set value to the frame counter 911 to ensure that next FAS is found on defined position. The FAS search block 901 provides information to the framer supervision block 902 about the position of the FAS in order to start the frame counter 911 with a defined offset.

Due to timing requirements the FAS search has to be done for K+47 positions in parallel. This can be done by delaying the data bus by one clock cycle (=T) by delay 906 and combine them with 47 bits of the next clock cycle, which has been explained in more detail in connection with the shift block 301 FIG. 4. The framer 306, however, does not need a barrel shifter 403 shown in FIG. 4 for the FAS search.

The FAS pattern cannot be searched as a whole 48 bit pattern because a not aligned deinterleaver separates it. Therefore we search for two 24-bit patterns FAS_A=0xF6F6F6 in FAS_A search block 941 and FAS_B=0x282828 FAS_B search block 942. Search is done as long as the framer supervision block states OOF=1 state and until the first occurrence of FAS_A or FAS_B in the data signal. The signal FAS_FOUND shall indicate to the frame supervision block 902 immediately when the FAS_A or FAS_B is detected. Additionally a FRCNT_SET value is determined and provided to the frame supervision block to set the frame counter 911 to the appropriate value to ensure that next occurrence of FAS in the data stream can be supervised.

The position where the FAS was found within the K+47 bit search bus is indicated to the shift block by shift interface 310.

Table 2 illustrates an implementation example how the feedback signal POS_SHIFT on the shift interface 310 is generated in dependence from the FAS positions.

TABLE 1

Examples of FAS pattern positions for K = 64

| FAS_A found on position | FAS_B found on position | shift interface |
|---|---|---|
| K − 17 to K − 40 | K − 41 to K − 64 | 63 |
| . . . | . . . | . . . |
| K − 2 to K − 25 | K − 26 to K − 49 | 48 |
| K − 1 to K − 24 | K − 25 to K − 48 | 47 |
| K to K − 23 | K − 24 to K − 47 | 46 |
| K + 1 to K − 22 | K − 23 to K − 46 | 45 |
| . . . | . . . | . . . |
| K + 45 to K + 22 | K + 21 to K − 2 | 1 |
| K + 46 to K + 23 | K + 22 to K − 1 | 0 |

Independence from POS_SHIFT and the detected FAS_A or FAS_B it is possible to determine the value to which value FRCNT_SET the frame counter needs to be set to ensure that at repetitions of counter value X the next FAS is visible on lines K−48 to K−1 of the connection to block 901, which corresponds to lines K−48 to K−1 of connection 302 and 314.

Generic formulas are provided below, implementation may be differently:

```
IF ((FAS_A AND POS_SHIFT==0...40) OR
   (FAS_B AND POS_SHIFT==0...16))
        FRCNT_SET = X − v * POS_SHIFT
ENDIF
IF (FAS_B AND POS_SHIFT==40...63)
        FRNCT_SET = X + 64 − v * POS_SHIFT
ENDIF
```

FAS_A when FAS is misaligned (POS_SHIFT not equal to 0) is always detected later to its nominal position X. X is the time where FAS is expected on the data bus for FAS confirmation. FAS_B detected with POS_SHIFT smaller than 17 is always detected later to its nominal position X. FAS_B detected with POS_SHIFT is bigger than 40 is always detected earlier to its nominal position X.

If both FAS_A and FAS_B are detected and lead to different POS_SHIFT values, then the result shall be ignored and search continues without providing new FAS_FOUND signal and POS_SHIFT value to the relevant blocks.

In this example POS_SHIFT=0 shall be the default value after reset.

In case when switching from OOF=0 to OOF=1 then POS_SHIFT shall be set to 0 and hold until a new FAS_A or FAS_B is found and therefore a new POS_SHIFT value was determined.

The FAS confirm block 905 compares the received data with the correct FAS sequence on positions K−1 to K−48 of the incoming data connection 314. In addition, the FAS confirm block 905 receives the signal FASPOS signal 935 from the framer supervision block 902 which defines the expected position of the next FAS sequence. It is not sufficient to find the FAS sequence somewhere in the middle of a frame, rather the FAS sequence is only considered valid at the beginning of the following frame. The FASPOS signal 935 may be considered an activation signal for the FAS confirm block 905 and may be used for power saving in the FAS confirm block 905, while a FAS sequence is not expected.

Output 931 to the error counter block are two values FALSE_ONES and FALSE_ZEROS which are the number of false 1 (0 received instead of expected 1) in the FAS, respective number of false 0 (1 received instead of expected 0) together with a pulse FASCNT_UPDATED to indicate that the counters have been updated after each frame.

Output 932 to the framer supervision block is FAS_OK and to indicate a good FAS and FAS_NOK if FAS is bad. In state 1001 two error-free parts FAS_A and FAS_B of a FAS are required for moving to state 1002. In state 1002 the received FAS pattern may contain a number of acceptable errors 933 FASERR_OK_ALLOW for being considered good (OK). FASERR_OK_ALLOW is provided by the register map as control signal.

To decide in state 1003, if the FAS is bad (NOK), the received pattern must exceed a number of acceptable errors FASERR_NOK_EXCEED that is provided by the register map as control signal.

The framer supervision block 902 contains the OOF state machine 912 to declare or clear OOF and a frame counter 911 to generate frame synchronous control signals which constitute the frame position information on interface 313. The length of the frame FL (distance between two FAS) is defined by a provisioned signal FRM_LENGTH from the register map. FRM_LENGTH is the frame length in bits divided by K. A typical value for FRM_LENGTH is 2040 (dec). FRM_LENGTH may range from 128 to 65535. The frame counter 911 shall be reset to a defined value FRCNT_SET when the FAS_FOUND signal is received. This FRCNT_SET value is dependent from the position the FAS was found. In absence of reset and FRCNT_SET signals the frame counter 911 shall run in continuous mode to provide equidistant frame pulses. Via an external resynchronization signal 934 DINT_RESYNCH the frame search can be started manually.

The error counter block 904 contains the LOF state machine 921 to declare or clear LOF and counters 922 to accumulate errors within the FAS for a defined interval.

The error counter block 904 receives its information from the FAS confirm block 905 and accumulates the FALSE_ONES and FALSE_ZEROS during an interval of time FASERR_TIME (max 1 second) provided by the register map and considered as static. At the start of each interval the counters start with value zero.

The error counter block 904 provides the accumulator values FALSE_ONES_ACCU and FALSE_ZEROS_ACCU that are the accumulation results of the last interval to the external register map together with a pulse ACCU_UPDATED whenever a new accumulation value is available which is true at the end of an accumulation interval. ACCU_UPDATED is implemented as event bit in the register map and can generate an interrupt. For further illustration during an accumulation interval the results of the last interval are presented via registers FALSE_ONES_ACCU and FALSE_ZEROS_ACCU. During LOF=1 state the counters shall have an input of zero (counters are on hold), during LOF=0 counters shall normally count the detected errors.

The counters shall have a size of 20 bits and saturate at their maximum value when excessive errors are received.

Figure 11:
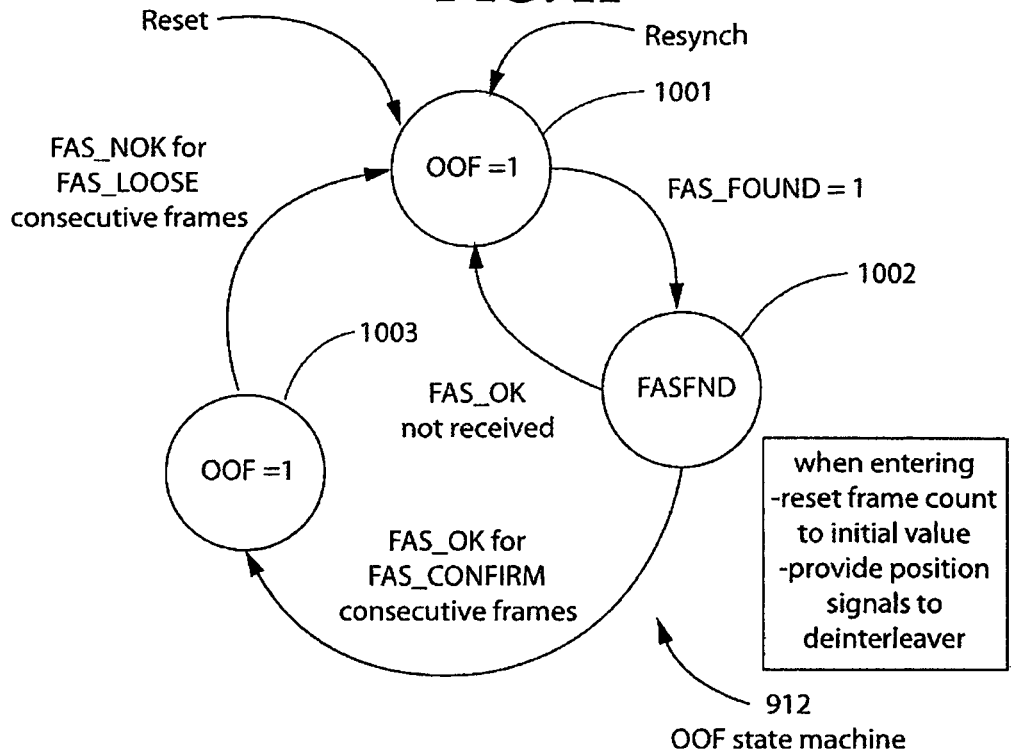
FIG. 11 shows an OOF state machine.

FIG. 11 illustrates the operation of the OOF state machine 912.

Following external parameters control the state machine:
1. Provided by register map static
   FAS_CONFIRM: number of consecutive frames for which FAS_OK shall be received
   FAS_LOOSE: number of consecutive frames for which FAS_NOK shall be received to declare OOF=1
   FASERR_OK_ALLOW: number of allowed bit errors in the FAS to still declare FAS_OK
   FASERR_NOK_EXCEED: number of bit errors which need to be exceeded to declare FAS_NOK
   DINT_RESYNCH: resynchronization signal for FAS search (detection of positive edge required)
2. Provided by FAS confirm block 905 and FAS search block 901
   FAS_FOUND: FAS detected for the first time
   FAS_OK: correct FAS detected
   FAS_NOK: incorrect FAS detected After a reset of the receiver or after a resynchronization signal 934 is received, OOF is declared which sets the OOF state machine to state 1001. The OOF state machine 912 is also set to state 1001, if in state 1003 an incorrect FAS was detected for FAS_LOOSE consecutive frames. Finally the OOF state machine 912 changes from state 1002 to state 1001, if an single incorrect FAS has been detected.

The OOF state machine goes from state 1001 to state 1002, if a FAS is detected for the first time. When entering into the state 1002 the frame counter 911 is reset to its initial value and frame position information is provided to the shift block 301 by the shift interface 310 and to the permutation controller 307 by interface 313. If FAS_CONFIRM consecutive frames with a correct FAS (=FAS_OK) have been received, the OOF state machine 912 goes from state 1002 to state 1003.

Figure 12:
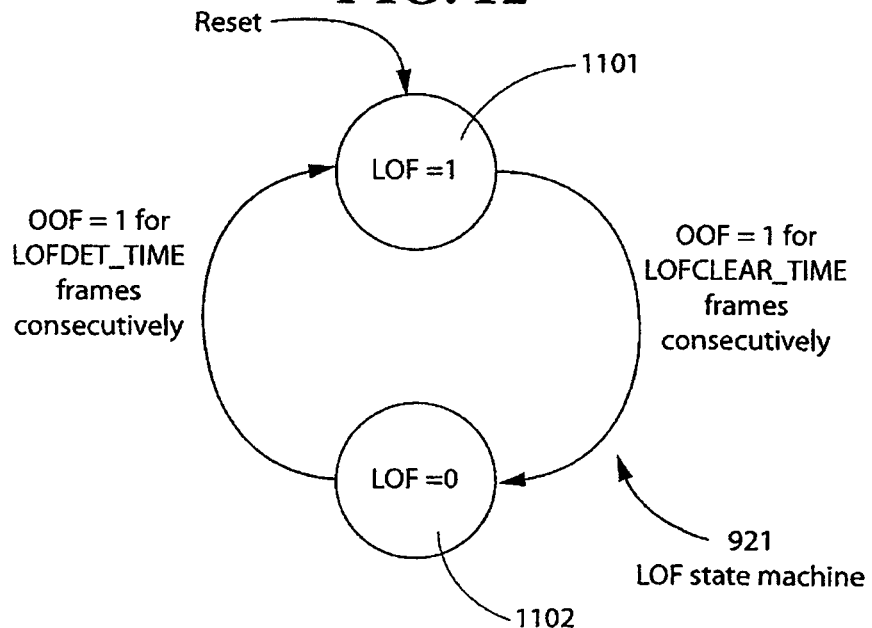
FIG. 12 shows a LOF state machine.
Figure 13:
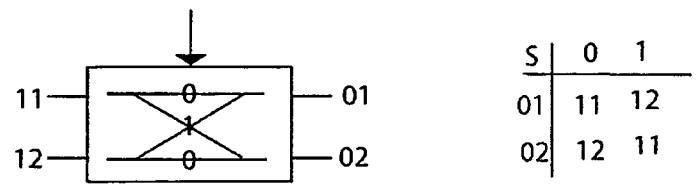
FIG. 13 shows a base element of a Benes network.
Figure 14:
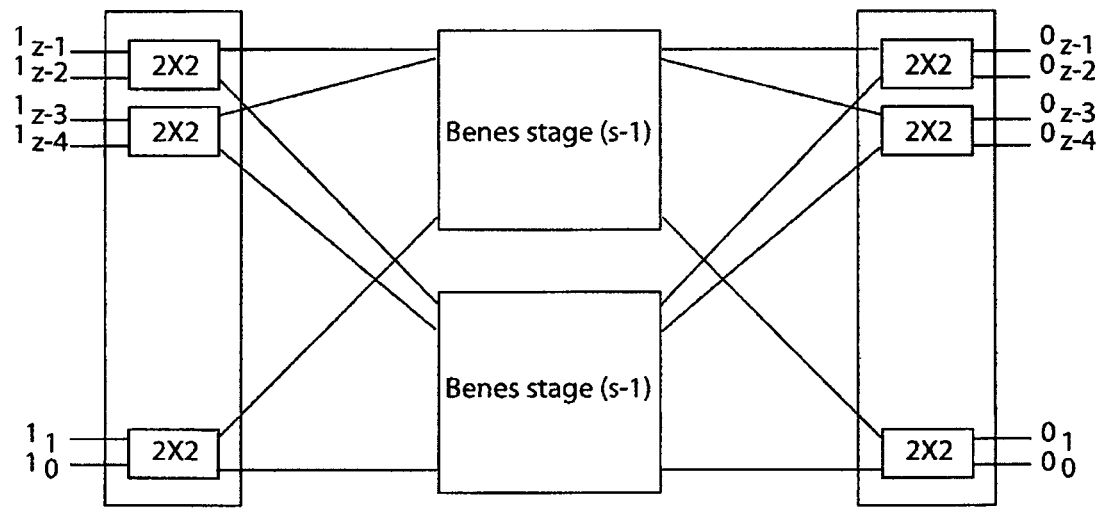
FIG. 14 illustrates the Benes network construction.
Figure 15:
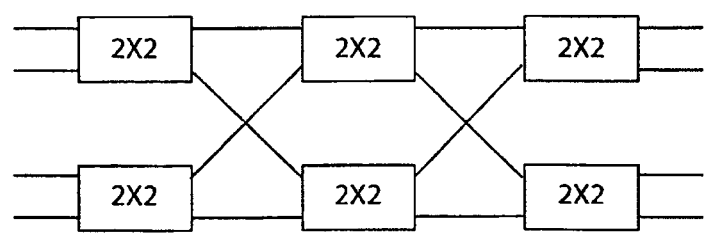
FIG. 15 shows a Benes network for s=2 with four inputs and outputs.

FIG. 12 shows the LOF state machine 921. LOF shall be declared and the LOF state machine switch to state 1101 when an OOF condition persists for a minimum of LOFDET_TIME. The integrating timer shall not be reset until OOF is inactive for continuously LOFDET_TIME. LOF shall be cleared and the LOF state machine 921 be switched to state 1102, when OOF is inactive for continuously LOFCLEAR_TIME. The LOFDET_TIME and LOFCLEAR_TIME are provided by register map and considered as static. LOFDET_TIME and LOFCLEAR_TIME are specified as number of frames. LOF state is reported to register map.

The error decorrelator 25 receives a clock and a full synchronous reset signal. This reset shall be used in the combinatorial logic to achieve the required state. It is essential to reset the internal state machines 912 and 921 and the signals to the register map. However it might be a good idea to also reset the complete storage elements.

In case of descrambler bypass is activated (DINT_BYPASS=1) the descrambler 303 shall be configured to power safe mode. This shall be done disabling of the clock for the descrambler 303. The VHDL code needs to be written accordingly to support dynamic clock gating by synthesis.

When bypass is active (DINT_BYPASS=1) the alarms and counter values to the register map shall be set to '0'.

The FAS search block 901 is a complex block and power saving is required. In case of OOF=0 the search logic can be disabled until OOF is set to 1. VHDL code needs to be written accordingly to support dynamic clock gating by synthesis under control of the OOF state.

Depending from the size of s following implementation details can be derived for other embodiments:

TABLE 2

Implementation details for Benes network

| s | NoInp = K | NoSw | NoSt | Possible Permutations (for 5-bit bursts) | Max. Permutations per G.709 frame (standard def.) |
|---|---|---|---|---|---|
| 8 | 256 | 1920 | 15 | $1.1 * 10^{12}$ | 510 |
| 7 | 128 | 832 | 13 | $3.1 * 10^{10}$ | 1020 |
| 6 | 64 | 352 | 11 | $9.1 * 10^{8}$ | 2040 |
| 5 | 32 | 144 | 9 | $2.4 * 10^{6}$ | 4080 |
| 4 | 16 | 56 | 7 | $5.2 * 10^{5}$ | 8160 |
| 3 | 8 | 20 | 5 | 6720 | 16320 |

The parallelism parameter K is chosen to be equal to NoInp.

The number of permutations for a 5-bit burst $Perm_{5bit}$ is calculated as follows:

$$Perm_{5bit} = NoInp! - (NoInp-5)! \quad (8)$$

It can easily be seen that s=3 would lead to a repetition of the permutation within one G.709 frame (16320 is bigger than 6720). All other combinations of the table 3 can satisfy the request that a permutation shall be unique within one frame.

Turning now to the distribution of errors for delay deinterleaver, we may consider an error burst of length R with bits $X_0, X_1, \ldots, X_{R-1}$ in the incoming data stream. We want to understand how bits are distributed after passing the synchronized deinterleaver 305. The minimum distance between $X_r$ and $X_{r+1}$ after delay deinterleaving is given by K−1.

The structure of the deinterleaver 305 separates an error burst of R<=K always into individual bits. Error bursts of R>K will result in neighboring bits $X_r$ and $X_{r+K+1}$ after deinterleaving.

For example if R=K+7 then we would find 7 neighbored pairs of bits as are $X_{K+7}$ and $X_6$, $X_{K+6}$ and $X_5$ and so on to $X_{K+1}$ and $X_0$.

When the Benes network 601 is set to transparent mode, with the given sets of parameters we achieve

TABLE 3

Error distribution dependent from mode

| K | Max burst length to avoid double errors (:= MBL) | Min distance between 2 errors if R <= MBL | Distance between 2 neighbor errors |
|---|---|---|---|
| 64 | 64 | 65 | 65 |

Further modifications and variations of the present invention will be apparent to those skilled in the art in view of this description. Accordingly, this description is to be construed as illustrative only and is for the purpose of teaching those skilled in the art the general manner of carrying out the present invention. It is to be understood that the forms of the invention shown and described herein are to be taken as the presently preferred embodiments.

REFERENCE LIST

| | | | |
|---|---|---|---|
| 1 | optical data transmission system | 307 | permutation controller |
| 5 | optical fiber | 308 | DSP |
| 11 | payload symbol stream | 309 | bi-directional interface |
| 12 | forward error correction (FEC) circuit | 310 | shift interface |
| | | 311 | connection |
| 13 | framed symbol stream | 312 | OOF line |
| 14 | frame position information | 313 | interface |
| 15 | transmitter reorder block | 401 | select connection |
| 16 | symbol stream | 402 | delay |
| 19 | optical transmitter | 403 | barrel shifter |
| 21 | payload symbol stream | 501 | link pattern |
| 22 | forward error correction circuit | 601 | Benes network |
| 23 | framed symbol stream | 602 | Benes network |
| 25 | error decorrelator | 302, 304 | data connections |
| 26 | received reordered symbol stream | 701 | address controller |
| | | 702, 703, 704, 705, 706, 707 | RAM |
| 27 | equalizer | 708 | multiplexer |
| 28 | quasi-analog output | 710 | address interface |

-continued

| | | | |
|---|---|---|---|
| 29 | optical receiver | 721 | PRBS circuit |
| 203 | scrambler | 740 | modify circuit |
| 204 | data connection | 741 | clock line |
| 205 | interleaver | 742 | line |
| 207 | permutation controller | 743 | frequency divider |
| 208 | digital signal processor | 751 | ROM |
| 209 | interface | 752 | linear shift register |
| 211 | connection | 753 | XOR gate |
| 300, 302, 304, 314 | data connection | 754 | buffer |
| 301 | shift block | 721, 722, . . . 736 | PRBS circuit |
| 303 | descrambler | 800, 860, 861, 862, 863 | shift register |
| 305 | deinterleaver | 901 | FAS search block |
| 306 | framer | 902 | framer supervision block |
| 903 | alarm generation block | | |
| 904 | error counter | | |
| 905 | FAS confirm block | | |
| 906 | delay | | |
| 911 | frame counter | | |
| 912 | OOF state machine | | |
| 921 | LOF state machine | | |
| 922 | counters | | |
| 931, 932 | output | | |
| 933 | allowed errors | | |
| 934 | resynchronization signal | | |
| 935 | FASPOS signal | | |
| 941 | FAS_A search block | | |
| 942 | FAS_B search block | | |
| 1001, 1002, 1003, 1101, 1102 | stat | | |

What is claimed as new and desired to be protected by Letters Patent of the United States is:

1. An apparatus comprising:
   an input configured to receive a stream of digital symbols;
   a transmitter reorder circuit electrically connected to the input comprising:
      an interleaver configured to rearrange one or more of the digital symbols in a non-contiguous manner,
      a scrambler configured to exchange a position of a plurality of the digital symbols output by the interleaver with a position of other symbols output by the interleaver in accordance with a link pattern in order to generate a reordered digital stream comprising an irregular permutation of exchanged digital symbols that disturbs a re-arrangement regularity introduced by the interleaver and that is useable for effective separation of burst errors at an optical receiver, and
      a permutation controller comprising a plurality of pseudo random binary sequence circuits configured to generate the link pattern and configured to regularly provide the scrambler with a different link pattern at a selected number of clock cycles for use by the scrambler to exchange the position of a plurality of the digital symbols with the position of the other digital symbols; and
   an output connected to the transmitter reorder circuit configured to output the reordered digital stream to an optical transmitter circuit for transmission to the optical receiver.

2. The apparatus of claim 1, wherein the permutation controller is configured to regularly select a different link pattern at a first number of clock cycles during a first period of operation and at a second number of clock cycles during a second period of operation.

3. The apparatus of claim 1, wherein the permutation controller comprises:
   a memory for storing a plurality of link patterns generated by the plurality of pseudo random binary sequence circuits; and
   an address controller operatively connected to the memory for selecting one of the plurality of link patterns to be used to exchange the position of the plurality of digital symbols with the position of the other digital symbols.

4. The apparatus of claim 3, wherein the scrambler comprises at least one of a Benes network or a half Benes network.

5. The apparatus of claim 1, further comprising:
   a forward error correction (FEC) circuit configured to receive a payload symbol stream for transmission and to apply an FEC code to the payload symbol stream to generate the stream of digital symbols comprising a framed symbol stream that includes framing symbols and coded symbols.

6. The apparatus of claim 5, wherein the FEC circuit is configured to provide frame position information to the transmitter reorder circuit.

7. The apparatus of claim 1, wherein the optical transmitter circuit is configured to receive the reordered digital stream and to convert the reordered digital stream into an optical signal for transmission on an optical fiber.

8. An apparatus comprising:
   a forward error correction (FEC) circuit configured to receive a payload symbol stream for transmission and to apply an FEC code to the payload symbol stream to generate a framed symbol stream comprising a plurality of digital symbols;
   a transmitter reorder circuit electrically connected to the FEC circuit comprising:
      an interleaver configured to rearrange one or more of the digital symbols in a non-contiguous manner,
      a scrambler configured to exchange a position of the plurality of the digital symbols output by the interleaver with a position of other symbols output by the interleaver in accordance with a link pattern in order to generate a reordered digital stream comprising an irregular permutation of exchanged digital symbols that disturbs a re-arrangement regularity introduced by the interleaver and that is useable for effective separation of burst errors at an optical receiver, and a permutation controller comprising a plurality of pseudo random binary sequence circuits configured to generate the link pattern and configured to regularly provide the scrambler with a different link pattern at a selected number of clock cycles for use by the scrambler to exchange the position of a plurality of the digital symbols with the position of the other digital symbols; and an optical transmitter circuit configured to receive the reordered digital stream and to convert the reordered digital stream into an optical signal for transmission on an optical fiber.

9. The apparatus of claim 8, wherein the permutation controller is configured to regularly select a different link pattern at a first number of clock cycles during a first period of operation and at a second number of clock cycles during a second period of operation.

10. The apparatus of claim 8, wherein the permutation controller comprises:

a memory for storing a plurality of link patterns generated by the plurality of pseudo random binary sequence circuits; and an address controller operatively connected to the memory for selecting one of the plurality of link patterns to be used to exchange the position of the plurality of digital symbols with the position of the other symbols.

11. The apparatus of claim 10, wherein the scrambler comprises at least one of a Benes network or a half Benes network.

12. The apparatus of claim 8, wherein the framed symbol stream includes framing symbols and coded symbols, and wherein the FEC circuit is configured to provide frame position information to the transmitter reorder circuit.

13. A method comprising:

receiving, at an interleaver, a stream of digital symbols;

generating a plurality of link patterns with a plurality of pseudo random binary sequence circuits;

storing the plurality of link patterns in a memory;

regularly selecting a different one of the plurality of link patterns from the memory at a selected number of clock cycles;

exchanging, at a scrambler, a position of a plurality of the digital symbols output by the interleaver with a position of other symbols in the stream output by the interleaver in accordance with a most recent selected link pattern in order to generate a reordered digital stream comprising an irregular permutation of exchanged digital symbols that disturbs a re-arrangement regularity introduced by the interleaver and that is useable for effective separation of burst errors at an optical receiver; and outputting the reordered digital stream.

14. The method of claim 13, further comprising:

regularly selecting a different link pattern at a first number of clock cycles during a first period of operation and at a second number of clock cycles during a second period of operation.

15. The method of claim 14, further comprising:

exchanging the position of a plurality of the symbols output by the interleaver with a position of other symbols in the stream output by the interleaver using at least one of a Benes network or a half Benes network.

16. The method of claim 13, further comprising:

receiving a payload symbol stream for transmission; and applying a forward error correction (FEC) code to the payload symbol stream to generate the stream of digital symbols, wherein the stream of digital symbols comprises a framed symbol stream that includes framing symbols and coded symbols.

17. The method of claim 13, further comprising:

generating an optical signal based on the reordered digital stream at an optical transmitter circuit; and transmitting the optical signal to a receiver circuit.

* * * * *